United States Patent [19]

Enomoto

[11] Patent Number: 5,288,199

[45] Date of Patent: Feb. 22, 1994

[54] TRANSPORTING DEVICE OF MAGNETICALLY FLOATING TYPE

[75] Inventor: Yoshihiro Enomoto, Narashino, Japan

[73] Assignee: Seiko Seiki Kabushiki Kaisha, Japan

[21] Appl. No.: 950,437

[22] Filed: Sep. 23, 1992

[30] Foreign Application Priority Data

Oct. 3, 1991 [JP] Japan ................................. 3-256819

[51] Int. Cl.$^5$ ............................................ B25J 13/00
[52] U.S. Cl. ................................ 414/749; 414/744.6; 901/23
[58] Field of Search .................. 414/744.2, 744.6, 749, 414/750, 751, 3, 21; 294/907; 901/23, 24

[56] References Cited

U.S. PATENT DOCUMENTS 4,998,859  3/1991  Oshima et al. ................. 414/751 X Primary Examiner—Michael S. Huppert
Assistant Examiner—Donald W. Underwood
Attorney, Agent, or Firm—Bruce L. Adams; Van C. Wilks

[57] ABSTRACT

A transporting device of the magnetically floating type is disposed in a central area of a multi-chamber to transport a semiconductor wafer into and out of peripheral processing rooms. The transporting device is comprised of a movable slider member having a working arm disposed along an axial direction and a server disposed at an end portion of the working arm for carrying a wafer. An electromagnet magnetically floats the slider member to drive the same in the axial direction. Sensors sense the size of the gap between the electromagnet and the slider member. Based on the magnitude of the gap, a PID circuit controls an electric current supplied to the electromagnet to maintain the slider member in a horizontal attitude state. A comparator operates to detect a variation in the electric current flowing through the electromagnet in order to determine whether the server is loaded with the wafer.

11 Claims, 5 Drawing Sheets

TRANSPORTING DEVICE OF MAGNETICALLY FLOATING TYPE

BACKGROUND OF THE INVENTION

The present invention relates to a workpiece transporting device of the magnetically floating type suitable for use in a semiconductor fabrication system or the like, under a under vacuum condition.

Generally, a semiconductor wafer is treated within a vacuum chamber during the semiconductor fabrication process. The semiconductor wafers and other workpiece articles are handled by a transporting device within the vacuum chamber. Therefore, the transporting device is required to be free of dust during the course of the transporting operation. FIG. 6 shows an example of the conventional transporting device used under the vacuum condition. In the figure, a multi-chamber 1 is comprised of a plurality of processing rooms 2–4, a loading room 5 and an unloading room 6, the rooms being arranged around a central area of the chamber 1. A turntable 8 is disposed on the central area of the chamber 1. A transporting device 10 of the magnetically floating type is mounted on the turntable 8. This transporting device 10 has an arm 11 movable in the lengthwise or axial direction of the device. A server is provided at an end portion of the arm 11 for carrying a semiconductor wafer 13.

In such a multi-chamber, the semiconductor wafer 13 is charged and discharged into and from respective processing rooms 2–4, loading room 5 and unloading room 6 during the course of the fabrication process. For this handling, the turntable 8 is rotated to place the server of the arm 11 in front of a desired room, and then the arm 11 is extended or retracted to charge or discharge the semiconductor wafer 13 into or from that room. In this operation, it is necessary to check to see if the semiconductor wafer 13 is being carried on the server in order to ensure the correct fabrication process. However, there is no practical article sensor which is reliable in the vacuum. Therefore, conventionally an optical sensor is provided outside the multi-chamber 1 so as to detect the presence or absence of the semiconductor wafer 13. In order for the optical sensor to view the interior of the multi-chamber from the exterior thereof, a quartz glass piece 14 is fitted in an opaque top plate 15 in registration with a sensor (not shown in the figure).

However, such a multi-chamber 1 is costly since a plurality of the quartz glass pieces 14 must be fitted into the top plate 1. Further, each sensor must be addressed sequentially in synchronization with a position shift of the semiconductor wafer 13 during the course of the semiconductor fabrication process. A detection sequence of the sensors is provisionally set, but this complicated sequence is occasionally set erroneously to thereby cause a check miss.

SUMMARY OF THE INVENTION

In order to solve the above noted problem of the prior art, the inventive transporting device of the magnetically floating type comprises a slider member having a working arm disposed along an axial direction and a server disposed at an end portion of the working arm for carrying an article. Driving means has an electromagnet for magnetically floating the slider member to drive the same in the axial direction. Judging means operates to detect a variation in an electric current flowing through the electromagnet for judging as to whether the article is present or absent on the server.

DETAILED DESCRIPTION OF THE PREFERRED EMBODIMENT

Figure 1:
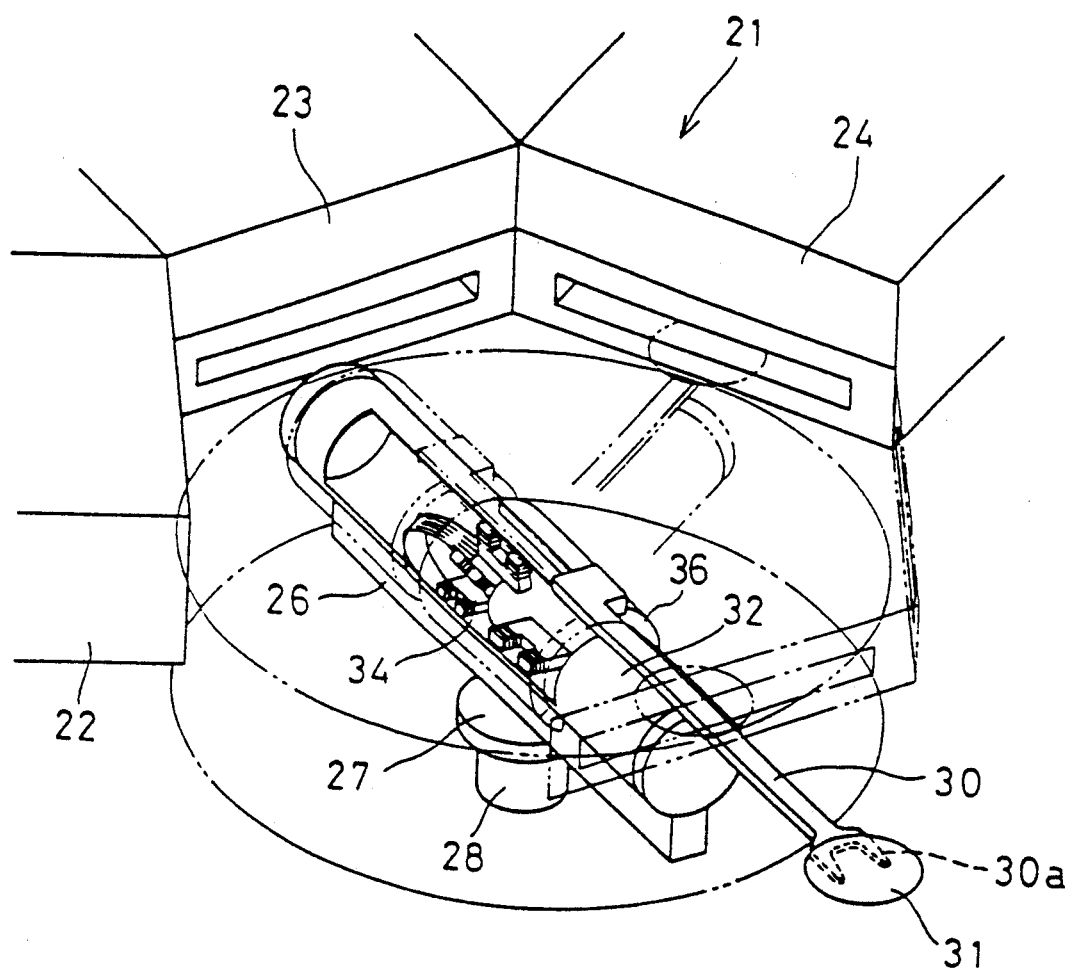
FIG. 1 is a partially broken perspective view showing one embodiment of the inventive transporting device of the magnetically floating type.

Hereinafter, embodiments of the present invention will be described in conjunction with the drawings. FIGS. 1–5 show one embodiment of the inventive transporting device of the magnetically floating type. FIG. 1 is a partially broken perspective view of a multi-chamber 21 where a top plate thereof is removed. A plurality of processing rooms 22–24 is disposed around a central area of the multi-chamber 21. A transporting device 26 of the magnetically floating type is provided in the central area of the multi-chamber 21. A turntable 27 is disposed to mount thereon the transporting device 26. The turntable 27 is supported by a shaft 28 rotatably disposed and movable up and down. Though not shown in the figure, additional processing rooms, and loading and unloading rooms are disposed behind the transporting device 26. The transporting device 26 of the magnetically floating type has a movable carrier member such as a slider member 36 disposed slideably in an axial or lengthwise direction. Workpiece holding means comprises, for example, a working arm 30 attached to the slider member 36, and a server 30a attached to a tip end portion of the arm 30 for carrying a semiconductor wafer 31. The slider member 36 is magnetically floated over a shield tube 32 in spaced relation by driving means such as magnetic bearings composed of plural electromagnets 34 (illustratively shown in FIG. 2). A driving current displaces the electromagnets in the lengthwise direction within the shield tube 32 so that the slider member 36 axially shifts correspondingly over the shield tube 32 while magnetically floating in a non-contact manner.

Figure 2:
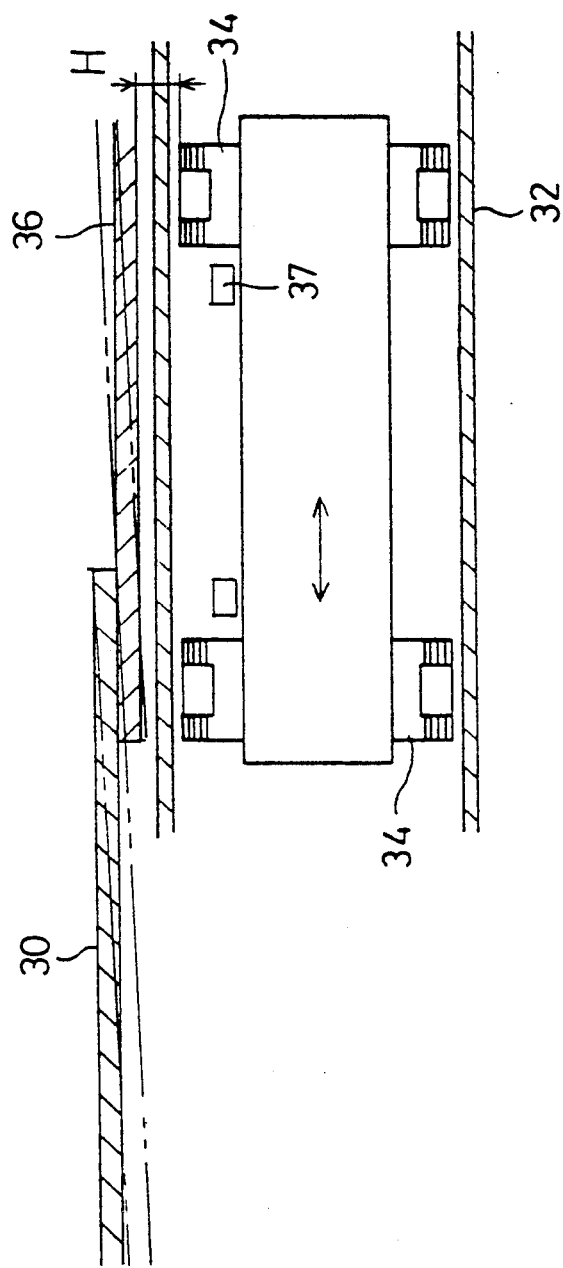
FIG. 2 is a schematic diagram showing operation of an electromagnet in the FIG. 1 transporting device.
Figure 3:
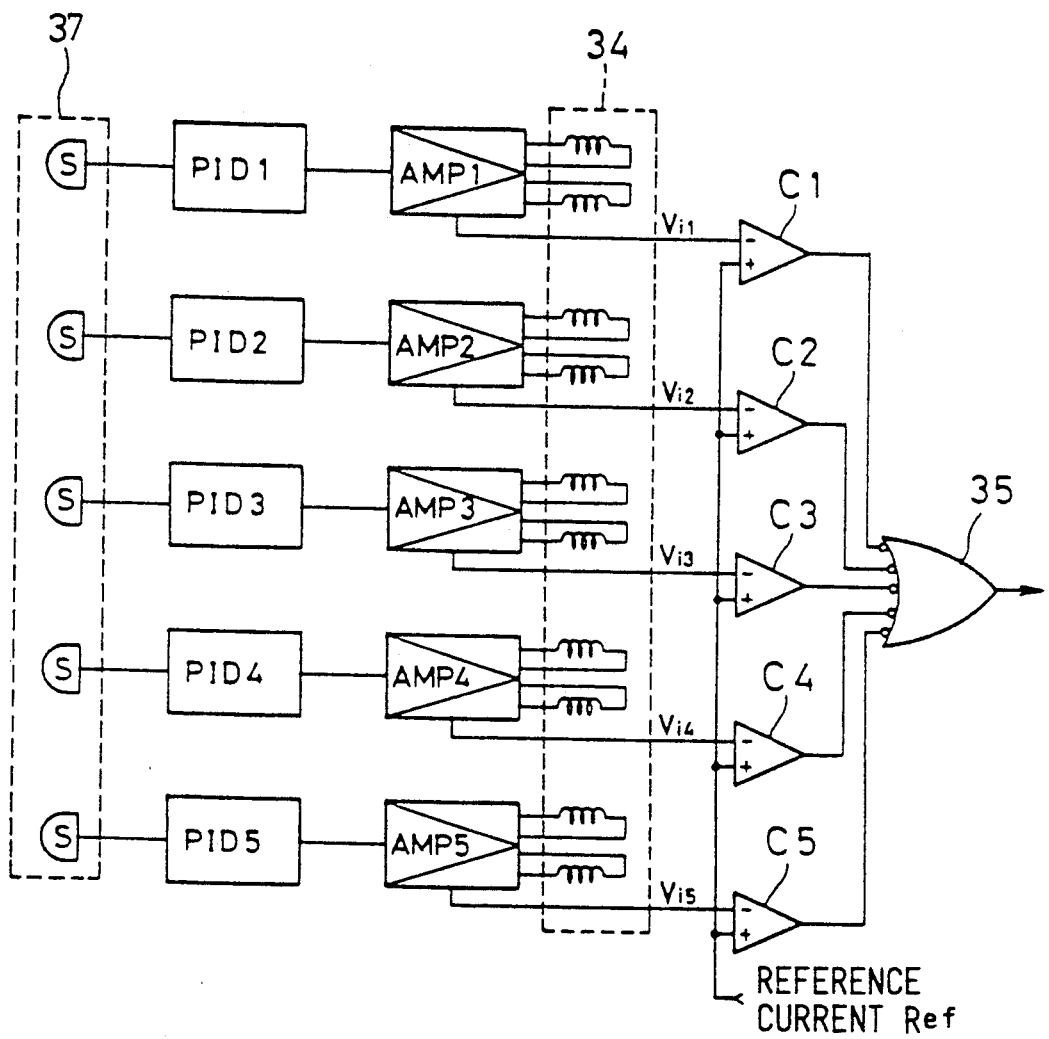
FIG. 3 is a circuit diagram including electromagnets of the FIG. 1 transporting device.

Referring to FIG. 2, while the server 30a is located leftward (outside of the drawing), five electromagnets 34 are arranged circumferentially (only four are seen in the drawing view). As shown in FIG. 3, a control circuit of the transporting device includes sensing means such as sensors 37 (S) for detecting the physical separation distance or size of a gap H between the slider member 36 and the electromagnets 34, control means such as proportional/integrating/differentiating (PID) circuits 1–5 for controlling an electric current flowing through the electromagnets 34 so as to keep constant the gap H, and amplifiers AMP1–AMP5. Each of the amplifiers AMP1–AMP5 is connected to a corresponding comparator C1–C5 which are inputted with a reference current Ref. Outputs from the respective comparators C1–C5 are inputted into an OR circuit 35.

In the thus constructed multi-chamber 21, and referring again to FIG. 1, the semiconductor wafer 31 is charged and discharged into and out of the respective processing rooms 22–24 during the course of fabrication of the semiconductor wafer. Namely, the turntable 27 and the shaft 28 are rotated so as to place the server 30a facing a desired room. Then, the slider member 36 having the arm 30 is displaced in the lengthwise direction of the shield tube 32 so as to charge or discharge the semiconductor wafer 31 into or out of that room.

During this handling, a check is made to see if the semiconductor wafer 31 is held on the server 30a as follows. Namely, the respective electromagnets 34 are supplied with electric currents through the corresponding PID circuits 1–5 (FIG. 3) in order to keep constant the gap H detected by the sensors 37 (S) between the electromagnets 34 and the slider member 36 (FIG. 2). In this operation, the supplied electric current is smaller than the reference current Ref when no article is loaded on the server 30a of the arm 30. If the semiconductor wafer 31 is loaded on the server 30a while the supplied electric current is kept small, the slider member 36 may decline as indicated by the double dot and chain line of FIG. 2. Therefore, when the semiconductor 31 is mounted on the server 30a, the electromagnets 34 are actually supplied with electric currents Vi greater than the reference current Ref in order to maintain the slider member 36 in a horizontal attitude state as indicated by the solid line of FIG. 2. Stated otherwise, when it is detected that the electric current Vi of the electromagnet 34 is greater than the reference current Ref, it is judged that the semiconductor wafer 31 is mounted on the server 30a. On the other hand, when it is detected that the electric current Vi of the electromagnet 34 is smaller than the reference current Ref, it is judged that the semiconductor wafer 31 is not loaded on the server 30a.

Figure 4:
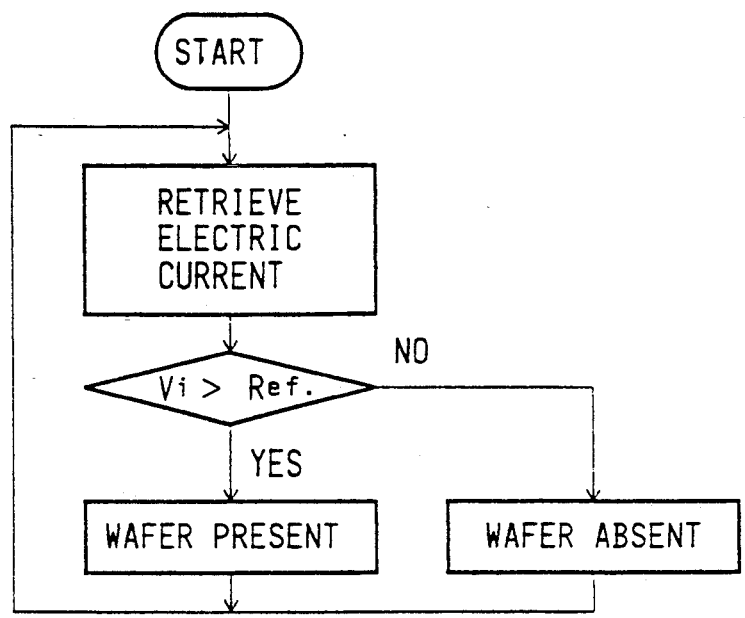
FIG. 4 is a flowchart showing the detecting operation of a semiconductor wafer in the FIG. 1 transporting device.

This electric current variation is utilized to detect the semiconductor wafer by determining means or judging means, as shown in a flowchart of FIG. 4. The judging or determining means comprises, in the preferred embodiment, the comparators C1–C5, and the OR gate 35. Firstly, the comparators C1–C5 retrieve the corresponding electric currents Vi1–Vi5 and compare the same with the reference current Ref. Then, when the OR circuit 35 judges any of the electric currents Vi1–Vi5 exceeds the reference current Ref, it is held that the semiconductor wafer 31 is present on the server 30a. On the other hand, when the OR circuit 35 judges that all of the electric currents Vi1–Vi5 are less than the reference current Ref, it is held that the semiconductor wafer 31 is absent on the server 30a.

Figure 5A:
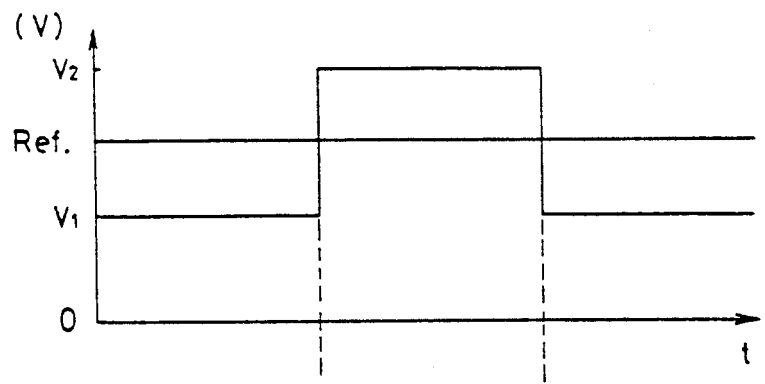
FIGS. 5a and 5b are a timing chart showing the output signal change of a comparator and an OR circuit included in the FIG. 3 circuit.
Figure 5B:
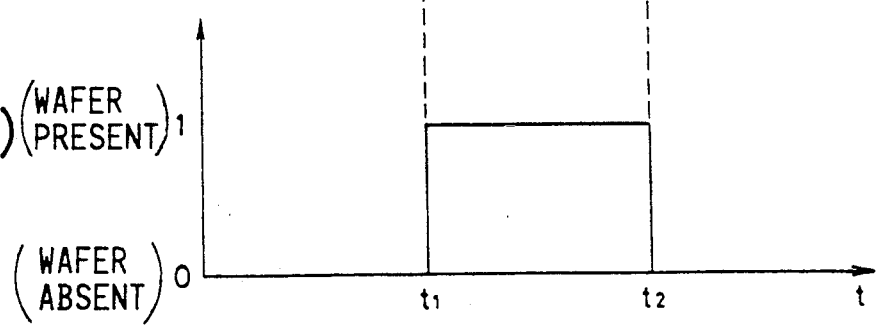
Figure 6:
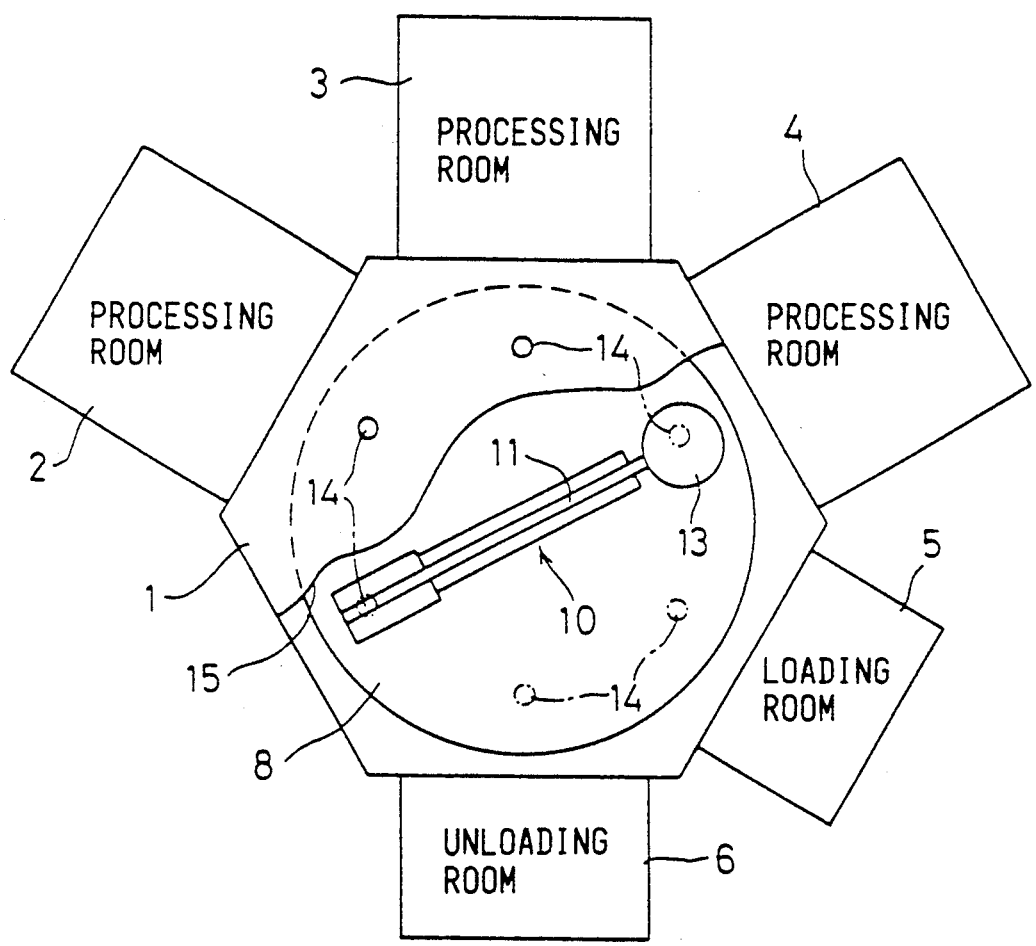
FIG. 6 is a partially broken plan view of the conventional transporting device of the magnetically floating type.

FIG. 5(a) is a timing chart showing signal variation outputted from each of the comparators C1–C5. When the semiconductor wafer 31 is mounted on the server 30a, the electric current Vi flowing through some of the electromagnets 34 reaches a value $V_2$ greater than the reference current Ref. When the semiconductor wafer 31 is removed from the server 30a the electric current Vi flowing through all of the electromagnets 34 falls to a value $V_1$ smaller than the reference current Ref. FIG. 5(b) is a timing chart showing a signal output variation at the OR circuit 35. The output signal changes to a high level when either of the comparators C1–C5 outputs a signal shown in FIG. 5(a).

As described above, according to the invention, electric current variation in the respective electromagnets is detected so as to judge presence and absence of an article to be transported. By such construction, the construction cost of the multi-chamber can be reduced in contrast to the conventional structure where optical sensors are provided outside the multi-chamber for detecting semiconductor wafers inside, and quartz glass pieces are fitted in an opaque top plate of the multi-chamber in alignment with the optical sensors. Further, according to the invention, there is rarely an erroneous judgment as to whether the semiconductor wafer is present or absent, thereby ensuring correct judgement without complicated work in contrast with the conventional structure where a complicated detection sequence must be set provisionally so as to operate the sensors to follow the position of the wafer during the course of semiconductor fabrication process, which is subject to inadvertent noncoincidence between the wafer and the sensor resulting in misjudgement.

What is claimed is:

1. A transporting device of a magnetically floating type, comprising:
   a slider member having a working arm disposed along an axial direction and a server disposed at an end portion of the working arm for carrying an article;
   electromagnet means for magnetically floating the slider member to drive the same in the axial direction;
   sensing means for sensing a width of a gap between the electromagnet means and the slider member;
   control means for controlling an electric current flowing through the electromagnet means in accordance with the gap width determined by the sensing means; and
   judging means operative to detect a variation in the electric current flowing through the electromagnet means for judging as to whether the article is present or absent on the server.

2. In a magnetically floating type workpiece transporting device having a movable carrier member attached to workpiece holding means for holding a workpiece, and driving means for magnetically floating the movable carrier member to drive the movable carrier member in an axial direction:
   sensing means for sensing a physical separation distance between the movable carrier member and the driving means;
   control means for controlling an electric current supplied to the driving means in accordance with the physical separation distance determined by the sensing means; and
   determining means for detecting a variation in the electric current flowing through the driving means in order to determine whether or not a workpiece is being held by the workpiece holding means.

3. A magnetically floating type workpiece transporting device according to claim 2; wherein the workpiece holding means comprises a working arm attached to the movable carrier member, and a server disposed on the working arm for holding the workpiece.

4. A magnetically floating type workpiece transporting device according to claim 2; wherein the driving means comprises at least one electromagnet.

5. A magnetically floating type workpiece transporting device according to claim 2; wherein the sensing means comprises at least one sensor.

6. A magnetically floating type workpiece transporting device according to claim 2; wherein the control means comprises a PID circuit connected to the sensor for controlling electric current supplied to the driving means.

7. A magnetically floating type workpiece transporting device according to claim 2; wherein the determining means comprises a comparator for comparing a reference current with the current supplied to the driving means in order to determine whether a workpiece is being held by the workpiece holding means.

8. A magnetically floating type workpiece transporting device according to claim 2; wherein the driving means comprises a plurality of electromagnets; the control means comprises a plurality of PID circuits each connected to a corresponding one of a plurality of sensors for controlling current supplied to each of the plurality of electromagnets; and the determining means comprises a plurality of comparators, each comparator corresponding to a respective one of the electromagnets for comparing a reference current with the current supplied to the comparator's corresponding electromagnet.

9. A magnetically floating type workpiece transporting device according to claim 8; including an OR gate connected to receive signals output from the plurality of comparators for determining whether a workpiece is being held by the workpiece holding means.

10. A magnetically floating type workpiece transporting device according to claim 8; including an amplifier disposed between each PID circuit and each electromagnet for supplying current to the electromagnets.

11. A magnetically floating type workpiece transporting device according to claim 9; including means for supplying the output of each amplifier as an input to a corresponding one of the comparators.

* * * * *